(12) United States Patent
Nishida

(10) Patent No.: US 6,229,472 B1
(45) Date of Patent: May 8, 2001

(54) A/D CONVERTER

(75) Inventor: Yoshio Nishida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/356,413

(22) Filed: Jul. 16, 1999

(30) Foreign Application Priority Data

Jul. 17, 1998 (JP) .................................................. 10-203432

(51) Int. Cl.⁷ .................................................. H03M 1/38
(52) U.S. Cl. .......................................... 341/161; 341/155
(58) Field of Search ................................ 341/140, 161, 341/155, 162

(56) References Cited

U.S. PATENT DOCUMENTS

| | | | |
|---|---|---|---|
| 4,893,124 | * | 1/1990 | Tsuji et al. ............................ 341/156 |
| 5,049,882 | * | 9/1991 | Gorecki et al. ...................... 341/162 |
| 5,426,431 | * | 6/1995 | Ryu ...................................... 341/161 |
| 5,534,864 | * | 7/1996 | Ono et al. ............................ 341/156 |
| 5,581,255 | * | 12/1996 | Hsu ...................................... 341/156 |
| 5,798,725 | * | 8/1998 | Okada .................................. 341/158 |
| 5,874,912 | * | 2/1999 | Hasegawa ............................ 341/161 |

FOREIGN PATENT DOCUMENTS

| | | | |
|---|---|---|---|
| 2-17725 | * | 1/1990 | (JP) . |
| 4-181814 | * | 6/1992 | (JP) . |
| 7-15336 | * | 1/1995 | (JP) . |
| 7-336225 | | 12/1995 | (JP) . |

* cited by examiner

Primary Examiner—Howard L. Williams
Assistant Examiner—Jean Bruner Jeanglaude
(74) Attorney, Agent, or Firm—Young & Thompson

(57) ABSTRACT

An A/D converter for converging an input analogue signal to a digital signal includes a reference voltage generator, a comparator and an encoder. The comparator comparing a plurality of reference voltages with the input analogue signal includes a first switch to which the analogue signal is input, an array of second switches connected between the reference voltages and a charge capacitor, and a comparator having an input connected to the charge capacitor and an output connected to the input of the comparator, and an encoder for encoding an output signal of the comparator.

8 Claims, 4 Drawing Sheets

A/D CONVERTER

BACKGROUND OF THE INVENTION (a) Field of the Invention

The present invention relates to an A/D converter, more in particular to the A/D converter outputting a digital signal converted from an analog signal by sequentially changing reference voltages one after another input to a comparator.

(b) Description of the Related Art

An A/D converter (ADC) operating at high speed and with low power dissipation has been conventionally developed by employing CMOS technology for a purpose is of integration to an LSI. Conventionally, the A/D converter realized by the CMOS technology includes all-parallel type, serial-to-parallel type and pipeline type converters.

The all-parallel type A/D converter as described in ICD94-49 and JP-A-95-336225 is a system in which comparison between an analogue input and $(2^N-1)$ reference voltages is collectively conducted by employing $(2^N-1)$ comparators. Such an A/D converter is shown in a block diagram of FIG. 1.

The A/D converter includes an input buffer (input amplifier) 15 to which an analogue signal Vin is input for driving a comparator array 18, a resistor ladder 11 for generating $(2^N-1)$ reference voltages Vref1 to Vrefn ($n=2^N-1$) connected between a first reference source line VRT and a second reference source line VRB, the comparator array 18 having a number of comparators 17 to which the reference voltages Vref1 to Vrefn from the resistor ladder 11 and an analogue signal Vin from the input buffer 15 are input, and an encoder to which outputs from the respective comparators 17 of the comparator array 18 are input. The respective comparators 17 includes a charge capacitor C having a first terminal connected to the input buffer 15 and to the corresponding reference voltage by switches SW1 and SW3, respectively, and an amplifier AMP having an input connected to a second terminal of a charge capacitor C and an output connected to the input of the amplifier AMP by a switch SW2.

The input voltage Vin is supplied to the amplifiers AMP of the respective comparators 17 through the input buffer 15. The switches SW1, SW2 and SW3 of the comparators 17 are controlled by clock signals. The switches SW1 and SW2 of the comparator 17 simultaneously become active at a high level of the clock signal φ1 and a charge corresponding to a difference between the input voltage Vin and an input offset voltage of the comparator AMP is charged in the charge capacitor C. When Xφ1 (Xφ1 is an inverted signal of φ1) rises to a high level, the switches SW1 and SW2 turn off and the switch SW3 turns on, the respective reference voltages Vref1 to Vrefn are connected to the corresponding comparators 17 to perform comparison between the input voltage Vin and the corresponding reference voltages Vref1 to Vrefn in the amplifier AMP of the respective comparators 17. Since, at this moment, the input offset voltage of the amplifier AMP of the respective comparators 17 remains charged, no error generated even if the amplifier AMP includes the input offset voltage, thereby performing the accurate comparison between the voltages having only a small difference.

A conventional pipeline type A/D converter is described, for example, in IEEE 1991 Custom Integrated Circuits Conference 26.4, and operates an A/D sub-converter of low resolution by means of pipeline type processing.

FIG. 2 is a block diagram showing such an A/D converter. The A/D converter includes an S/H amplifier 20 which conducts a sampling of analogue input, holds thereof (S/H) and supplies its output signal to a subtracter 21 and to an AID sub-converter (ADSC1) which performs analogue-to-digital conversion of the signal held by the S/H amplifier 20, a D/A converter (DAC1) for generating an analogue voltage corresponding to a digital output of ADSC1, an initial stage including the subtracter 21 for conducting subtraction between the held voltage and the voltage generated in DAC1, a plurality of interstage amplifiers 22, 24 and 25 for amplifying the results of the subtraction and having the S/H function, a number of intermediate stages having a similar structure to that of the initial stage and receiving output signals of the respective interstage amplifiers 22 and 24, an A/D sub-converter (ADSCn) for receiving an output signal from an interstage amplifier 25 of the final stage, and a digital correction circuit 26 for receiving data input from the ADSCs of the respective stages for correction to output a digital output Dout.

The throughput of the processing is increased in the A/D converter of FIG. 2 due to pipeline-processing of the respective stages. The A/D sub-converter ADSC employed herein is basically the same as the all-parallel type A/D converter already mentioned, and the respective A/D converters are equipped with the comparators as mentioned above. Since, in this structure, the resolution of each stage is low and the number of the comparators is not so large, the power dissipation in the comparators is small and the power dissipation in the S/H amplifier and the interstage amplifiers of the respective stages is rather large.

In the pipeline system of FIG. 2, the serial-to-parallel type A/D converter adopts a two-stage structure. That is, the structure excluding a D/A converter (DAC2), the subtracter 23, the interstage amplifiers 24 and 25 and an A/D sub-converter (ADSCn) from the structure of FIG. 2 is employed. Also in this type of the A/D converter, the A/D sub-converter ADSC is basically the same as the all-parallel type A/D converter including the comparators.

Since the plurality of the comparators are connected in parallel to the output of the input amplifier 15 in the A/D converter of FIG. 1, the input capacitance of the comparator array observed from the input amplifier, of the S/H amplifier and of the interstage amplifier becomes as large as (charge capacitor C of comparator)×(the number of comparators) when the converter is employed as the A/D sub-converter in the pipeline type converters and in the serial-to-parallel type converters as well as when, of course, the converter is individually employed. Accordingly, the input buffer and the interstage amplifiers are required to have the high driving ability defectively resulting in the increase of power dissipation and of an occupied area.

SUMMARY OF THE INVENTION

It is therefore an object of the present invention, in view of the above, to provide an A/D converter which enables reduction of power dissipation and of an occupied area even without employing a large input buffer and an interstage amplifier having a large driving ability.

The present invention provides, in a first aspect thereof, an A/D converter for converting an input analogue signal to a digital signal comprising: a reference voltage generator for generating a plurality of reference voltages; a comparator for comparing the plurality of the reference voltages with the input analogue signal, the comparator including a first switch having a first terminal connected to an analogue input terminal, an array of second switches each having a first terminal connected to the corresponding reference voltage and a second terminal connected in common to a second terminal of the first switch, a charge capacitor having a first terminal connected to second terminals of the first switch and of the array of the second switches, and an amplifier having an input connected to a second terminal of the charge capacitor and an output connected to the input of said comparator by a third switch; and an encoder for encoding an output signal of the comparator.

The present invention provides, in a second aspect thereof, an A/D converter including: first and second reference voltage generator for generating a plurality of first reference voltages and a plurality of second reference voltages, respectively; fourth and fifth switches each having a first terminal connected to an analogue input signal and to an inverted signal of the analogue input signal, respectively; an array of sixth switches having respective first terminals connected to the first reference voltages and respective second terminals connected in common to second terminals of the fourth switch; an array of seventh switches having respective first terminals connected to the second reference voltages and respective second terminals connected in common to the second terminal of the fifth switch; a first charge capacitor having a first terminal connected to the fourth switch and to second terminals of the array of the sixth switches, a second charge capacitor having a first terminal connected to the fifth switch and to second terminals of the array of the seventh switches connected in common, a differential amplifier having a non-inverting input connected to an inverted output thereof by way of an eighth switch and to the first charge capacitor, and an inverting input connected to the non-inverting output thereof by way of a ninth switch and to the second charge capacitor; an encoder for encoding the outputs of the differential amplifier; and a control section for controlling timing of the above switches.

In accordance with the present invention, the load capacitor of the preceding stage amplifier of the comparator can be reduced to enable the high speed operation of the preceding stage amplifier, the reduction of power dissipation and the decrease of an occupied area by providing, in the comparator, the array of the switches for sequentially inputting the respective reference voltages to the charge capacitor.

The above and other objects, features and advantages of the present invention will be more apparent from the following description.

PREFERRED EMBODIMENTS OF THE INVENTION

Figure 1:
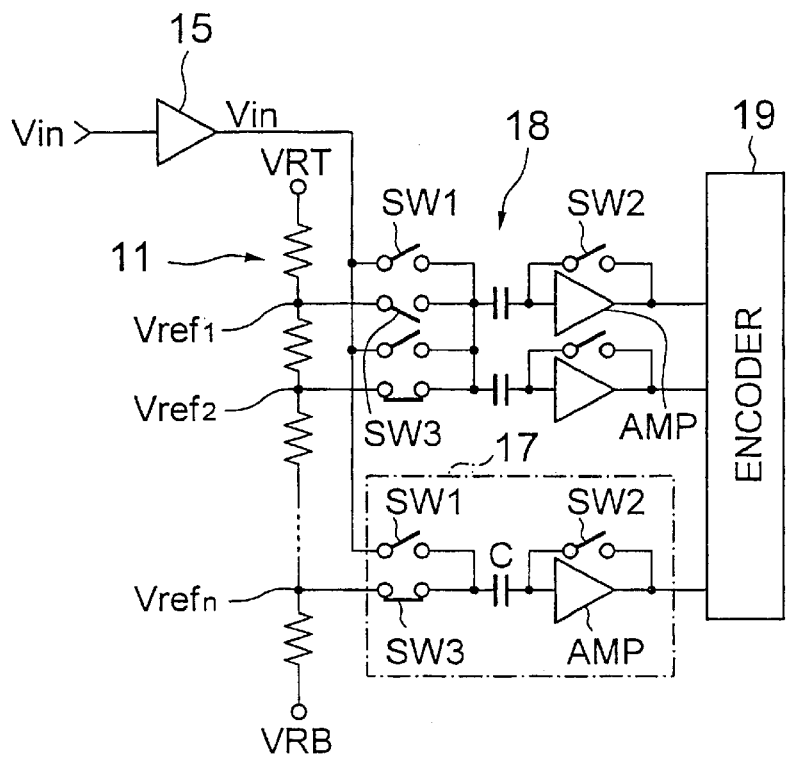
FIG. 1 is a block diagram showing an example of a conventional all-parallel type A/D converter.
Figure 2:
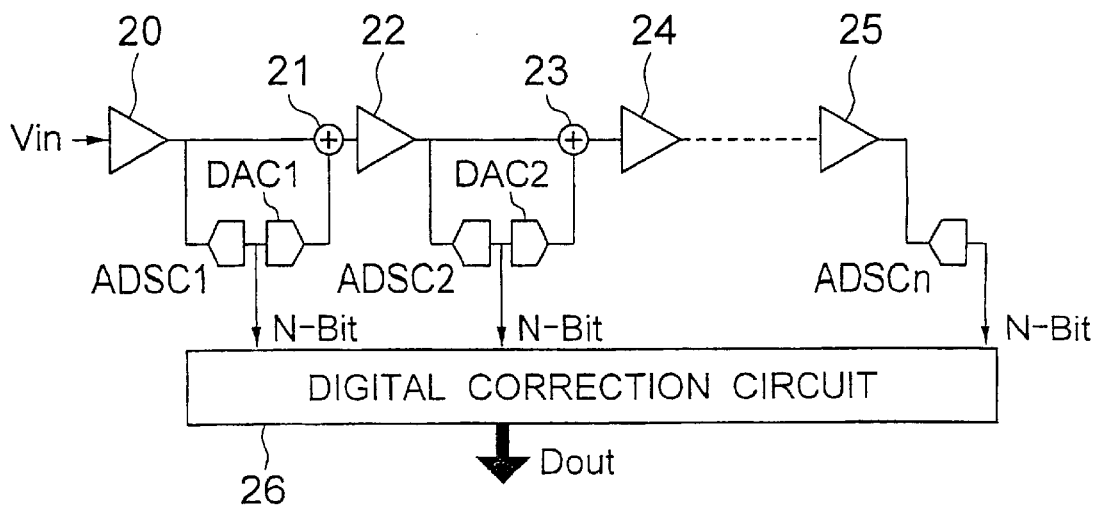
FIG. 2 is a block diagram showing an example of a conventional pipeline type A/D converter.
Figure 3:
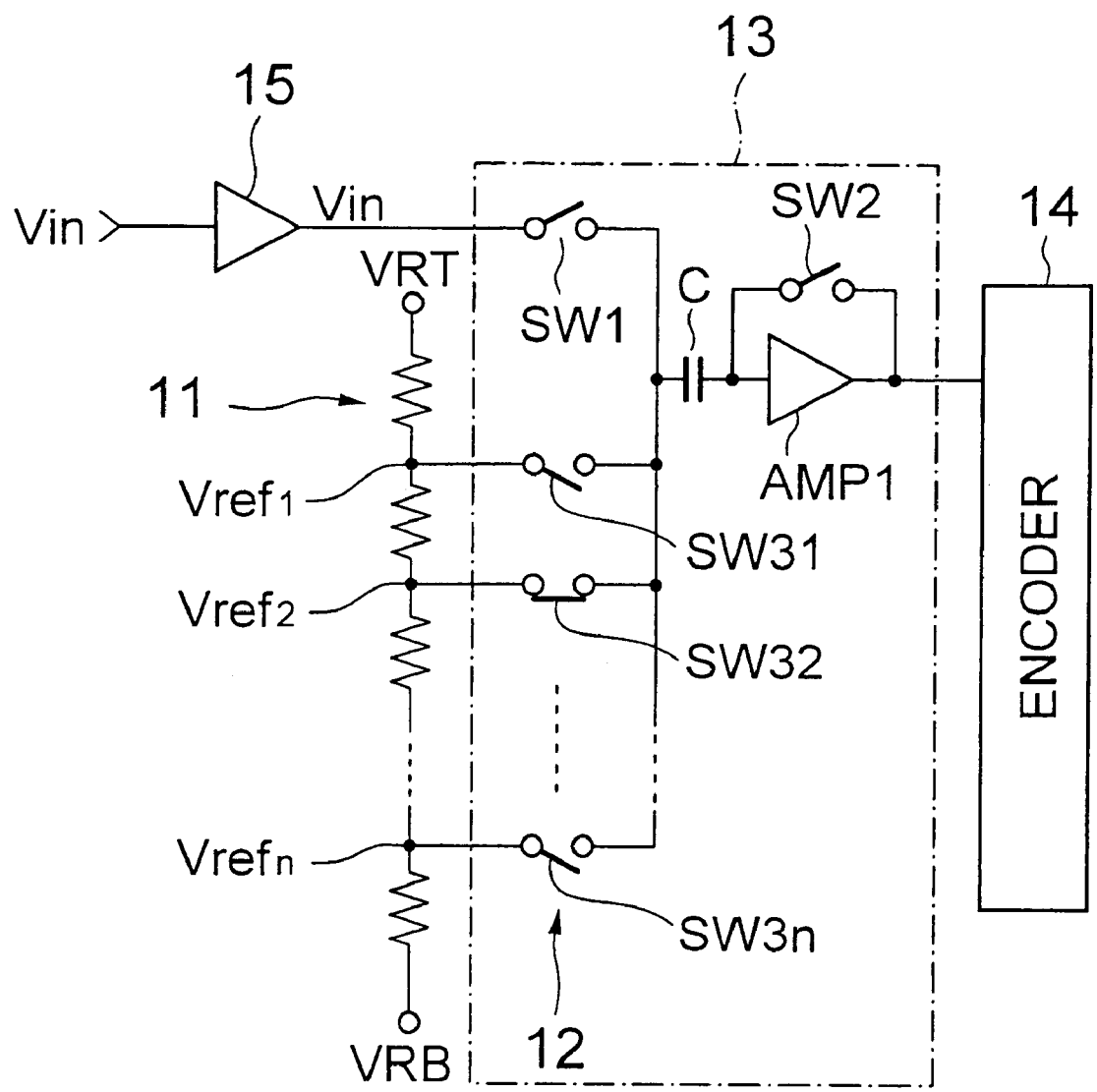
FIG. 3 is a block diagram showing a first embodiment of an A/D converter in accordance with the present invention.
Figure 4:
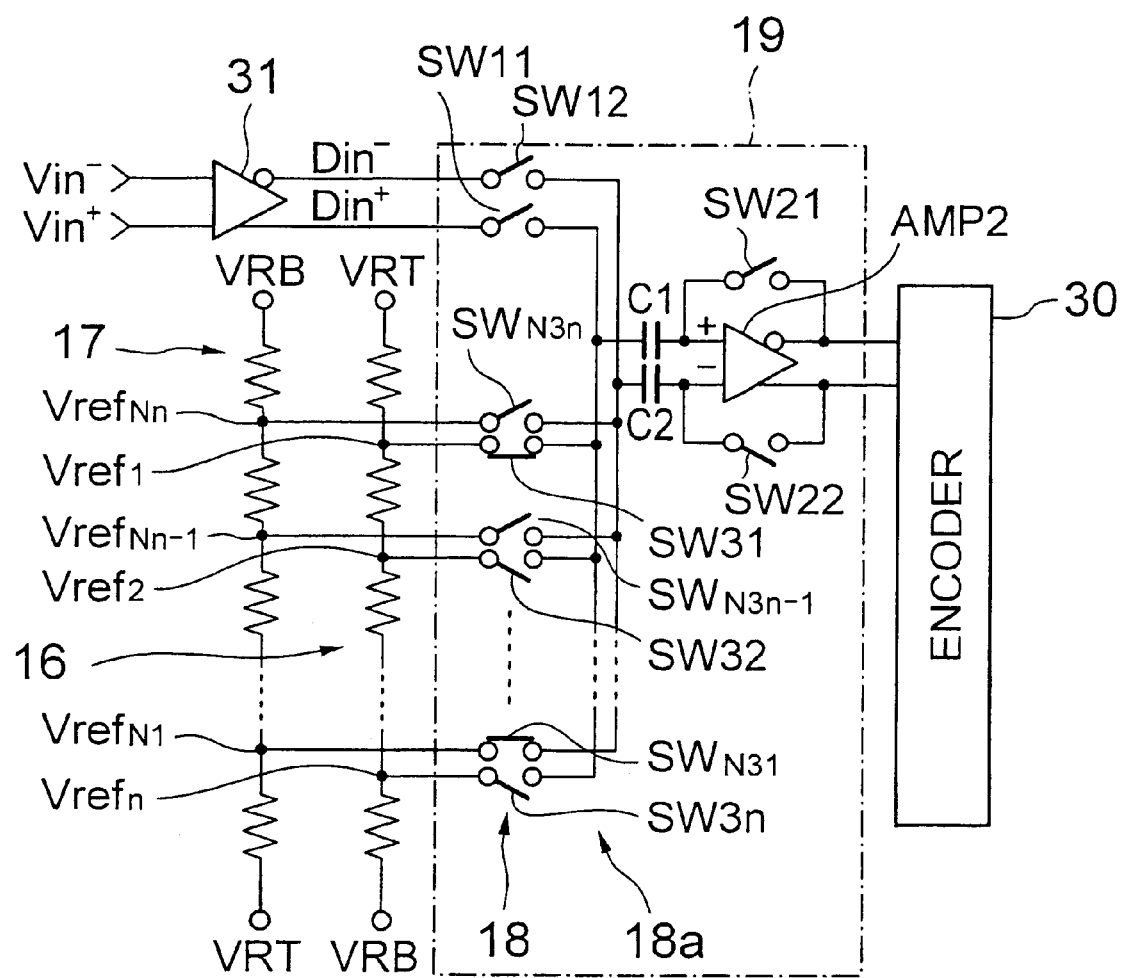
FIG. 4 is a block diagram showing a second embodiment in accordance with the present invention.
Figure 5:
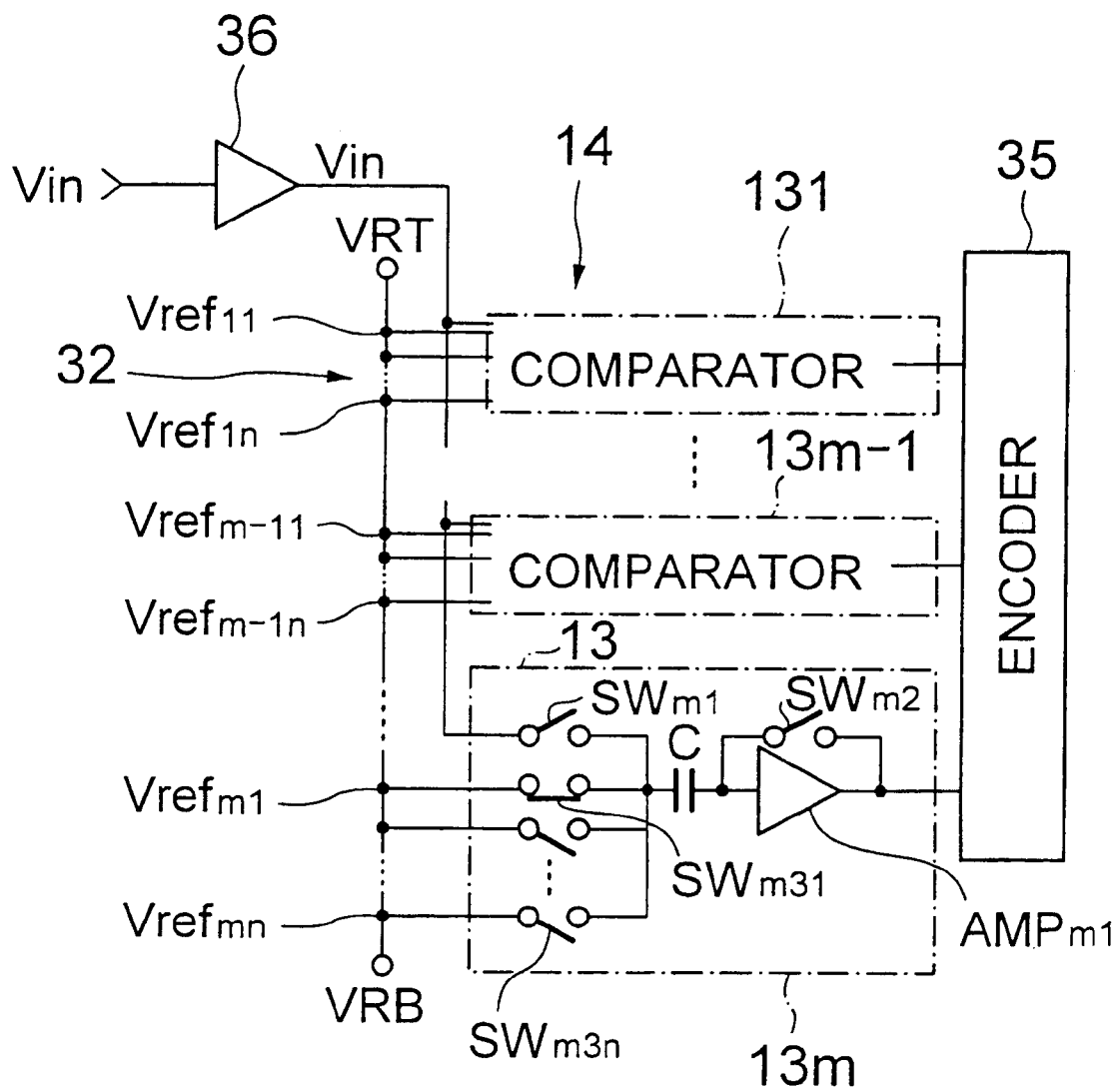
FIG. 5 is a block diagram showing a third embodiment in accordance with the present invention.

Now, the present invention is more specifically described with reference to accompanying drawings. In FIGS. 3 to 5, the same numerals as those of FIG. 1 exhibit similar elements in FIG. 1.

An A/D converter of a first embodiment of the present invention shown in FIG. 3 includes an input buffer 15 to which an analogue signal Vin is input, a resistor ladder 11 for outputting reference voltages Vref1 to Vrefn ($n=2^N-1$) connected between a first reference source line VRT and a second reference source line VRB, a comparator 13 for comparing the respective reference voltages Vref1 to Vrefn from the resistor ladder 11 with the analogue signal Vin input from the input buffer 15, and an encoder 14 for sequentially encoding output signals from the comparator 13.

The comparator 13 has a first switch SW1 having a first terminal connected to the output of the input buffer 15, an array of switches 12 including "n" second switches SW31 to SW3$n$ each having a first terminal connected to each of the corresponding reference voltage output nodes Vref1 to Vrefn and a second terminal connected in common to a second terminal of the first switch SW1, a charge capacitor C having a first terminal connected to the first switch SW1 and the second switches SW31 to SW3$n$, and an amplifier AMP1 having an input connected to a second terminal of a charge capacitor C and an output connected to the input thereof by a third switch SW2.

The A/D converter of the above embodiment operates as follows.

The input voltage Vin is supplied to a first terminal of the charge capacitor C of the comparator 13 through the input buffer 15 and the first switch SW1. The respective switches SW1, SW2, SW31 to SW3$n$ in the comparator 13 are so controlled that they sequentially turn on at the corresponding clock signals $\phi1$, $\phi2$, $\phi31$ to $\phi3n$. More in detail, when, at first, the clock signal $\phi1$ rises to a high level to turn on the switches SW1 and SW2, charge corresponding to a difference between the input voltage Vin and an input offset voltage of the amplifier AMP1 is charged in the charge capacitor C. At this moment, the output of the amplifier AMP1 remains in an intermediate level between a high level and a low level. When the clock signal $\phi1$ falls to a low level, the switches SW1 and SW2 turn off. When the clock signal $\phi31$ rises to a high level, the first reference voltage Vref1 is connected to a first terminal of the charge capacitor C of the comparator 13 to compare the input signal Vin with the reference voltage Vref1. If the input voltage Vin is smaller than the reference voltage Vref1 at this moment, the output of the amplifier AMP1 is shifted to a low level.

Then, the clock signal $\phi31$ falls to a low level to turn off the switch SW31, and the clock signal $\phi32$ rises to a high level to turn on the switch SW32. Thereby, the second voltage Vref2 is connected to a first terminal of the charge capacitor C of the comparator 13 to compare the input signal Vin with the second reference voltage Vref2. If the input voltage Vin is smaller than the second reference voltage Vref2, the output of the amplifier AMP1 remains at the low level. Then, in a similar manner, the respective second switches SW33 to SW3$n$ of the array of the switches 12 are sequentially connected based on clock signals to compare the input signal Vin with each of the reference voltages Vref3 to Vrefn. If the input voltage Vin is higher than the "m"th reference voltage Vrefm and lower than the "m-1"th reference voltage Vrefm-1, the output of the amplifier AMP1 turns to a high level by the "m"th clock signal $\phi3m$ having a high level, and the high level thereof remains for the succeeding clock signals. The levels of the inputs of the encoder with time are (000 . . . 011 . . . 11). The encoder 14 registers and encodes the time series inputs to output the digital values obtained by the conversion of the analogue input voltage into the digital signal.

In the A/D converter of the above embodiment, the input capacitor of the comparator 13 observed from the input buffer 15 is implemented by only one charge capacitor C, and thus is remarkably reduced compared with the conventional A/D converter having a number of charge capacitors connected in parallel. Accordingly, the changing speed of the output signal of the input buffer 15 increases, and the reduction of the power dissipation and of the occupied area of the A/D converter can be achieved.

A second embodiment of the present invention is illustrated in FIG. 4 in which two resistor ladders 16 and 17 are shown for avoiding complication of the drawing. However, these two ladders may be combined into one ladder. An A/D converter of this embodiment is an example of converting an analogue differential input signals Vin− and Vin+ into digital signals.

An input differential amplifier 31 receives differential input signals Vin+ and Vin− and outputs a non-inverted signal Din+ and an inverted signal Din− of differential outputs of the input signals to transfer the signals to a comparator 19. The first ladder 16 and the second ladder 17 are connected in parallel between a first reference source line VRT and a second reference source line VRB. The first ladder 16 outputs "n" reference voltages in a range from a maximum reference voltage Vref1 to a minimum reference voltage Vrefn, and the second ladder 17 outputs "n" reference voltages in a range from a minimum reference voltage VrefN1 to a maximum reference voltage VrefNn. The both resistor ladders have the same configuration. That is, Vref1=VrefN1, . . . Vrefn=VrefNn.

The comparator 19 includes a switch SW11 having a first terminal connected to the non-inverted output Din+ of the input differential amplifier 31, a switch SW12 having a first terminal connected to the inverted output Din− of the input differential amplifier 31, an array of switches 18 having sixth switches SW31 to SW3$n$ having first terminals connected to the reference voltages Vref1 to Vrefn of the first ladder 16 and an array of switches 18$a$ having seventh switches SWN31 to SWN3$n$ having first terminals connected to the reference voltages VrefN1 to VrefNn of the second ladder 17. A second terminal of the fourth switch SW11 is connected to the second terminals of the sixth switches SW31 to SW3$n$ connected to the first resistor ladder 16, and the second terminal of the fifth switch SW12 is connected to second terminals of the seventh switches SWN31 to SWN3$n$ connected to the second resistor ladder 17.

The comparator 19 further includes charge capacitors C1 and C2 having first terminals connected to the second terminals of the fourth and the fifth switches SW11 and SW12, respectively, an amplifier AMP2 for providing a digital output having a non-inverted input terminal connected to the second terminal of the charge capacitor C1 and an inverted input terminal connected to the second terminal of the charge capacitor C2, an eighth switch SW21 for connecting an inverted output terminal of the amplifier AMP2 with the non-inverted input terminal thereof, and a ninth switch SW22 for connecting a non-inverted output terminal of the amplifier AMP2 with the inverted input terminal thereof. The output of the amplifier AMP2 is input to an encoder 30.

The A/D converter of the present embodiment operates as follows.

When a clock signal $\phi 1$ rises to a high level after input of the analogue differential inputs Vin+ and Vin−, the non-inverted and the inverted difference outputs Din+ and Din− output from the input differential amplifier 31 are input to the charge capacitors C1 and C2 by way of the fourth and the fifth switches SW11 and SW12, respectively. The eighth and the ninth switches SW21 and SW 22 turn on to store, in the charge capacitors C1 and C2, charges corresponding to differences between the respective difference signals Din+ and Din− and the input offset voltage of the reference differential amplifier AMP2. Then, since the clock signal $\phi 1$ falls to a low level and a clock signal $\phi 31$ rises to a high level, the switches SW11, SW12, SW21 and SW 22 turn off and the switches SW31 and SWN31 turn on to apply the reference voltages Vref1 and VrefN1 to first terminals of the charge capacitors C1 and C2. Then, the reference voltages Vref2, VrefN2, Vref3 and VrefN3 . . . Vrefn and VrefNn are sequentially applied to first terminals of the charge capacitors C1 and C2.

After comparing the difference voltage between the difference signals Din+ and Din− with the respective difference voltages of the reference voltages Vref1 to Vrefn and VrefN1 to VrefNn, the output of the reference amplifier AMP2 maintains the low level while the difference voltage between the difference signals Din+ and Din− is lower than the difference voltage between the reference voltages, and the above output rises to a high level when the difference voltage between the difference signals Din+ and Din− becomes higher than the difference voltage between the reference voltages. The encoder 30 registers and encodes the levels of the inputs with time (000 . . . 011 . . . 11) and outputs the digital values obtained by the conversion of the difference signals of the differential input signals Vin+ and Vin− into the digital signal.

An A/D converter of a third embodiment shown in FIG. 5 is an example in which an input signal Vin of a single phase is converted into a digital signal similarly to the A/D converter of the first embodiment. In this embodiment, the analogue input signal can be converted into the digital signal with a higher throughput than that of the first embodiment.

The A/D converter of the present embodiment includes an input buffer 36, a resistor ladder 32 connected between reference source lines VRT and VRB, "m" comparators 131 to 13$m$ having a similar structure to that of the first embodiment, and an encoder 35 for encoding outputs received from the respective comparators. In the present embodiment, the resistor ladder 32 outputs reference voltages Vref11 to Vref1$n$, Vref21 to Vref2$n$, . . . , Vrefm1 to Vrefmn from the number of "n×m" nodes. To the first comparator 131 are input "n" reference voltages Vref11 to Vref1$n$. To the second comparator 132 are input "n" reference voltages Vref21 to Vref2$n$. In a similar and successive manner, to the "m"th comparator 13$m$ are input "n" reference voltages Vrefm1 to Vrefmn.

When an input analogue signal Vin is input to raise a clock signal $\phi 1$ to a high level, fourth and fifth switches SW11 to SWm1 and SW12 to SWm2 turn on to store, in the respective charge capacitors C11 to Cm1, charges corresponding to a difference between the input analogue signal Vin and an input offset voltage similarly to the first embodiment. When the clock signal $\phi 1$ turns off and the clock signal $\phi 31$ turns on, sixth switches SW131 to SWm31 of the first block of the respective comparators 131 to 13$m$ turn on and the input signal Vin and the reference voltages Vref11 to Vrefm1 are compared with each other in the comparators. Thereafter clock signals $\phi 31$ to $\phi 3m$ sequentially turn on, and the input analogue signal Vin and the reference voltages of each stage are similarly compared with each other in the comparators. When the input signal becomes larger than a certain reference voltage in at least one comparator 131 to 13$m$, a bit corresponding to the reference voltages higher than that is "0" and that corresponding to the reference voltages lower than that is "1". The encoder 35 encodes and outputs the data (000 ... 011 ... 11) consisting of the number of the bits obtained by multiplication between "n" and "m".

Although the examples of comparing the input signal Vin with the reference voltage Vrefn to its terminal even after the reference voltage Vref becomes lower than the input signal Vin have been described in the above embodiments, no comparison may be conducted thereafter and all the bits may be treated as "1".

Since the above embodiments are described only for examples, the present invention is not limited to the above embodiments and various modifications or alternations can be easily made therefrom by those skilled in the art without departing from the scope of the present invention.

What is claimed is:

1. An A/D converter for converting an input analogue signal to a digital signal comprising:

a reference voltage generator for generating a plurality of reference voltages;

a comparator for comparing the plurality of said reference voltages with said input analogue signal, said comparator including a first switch having a first terminal connected to an analogue input terminal, an array of plural second switches each having a first terminal connected to the corresponding reference voltage and a second terminal connected in common to a second terminal of said first switch, only one charge capacitor having a first terminal connected to second terminals of said first switch and of all of said plural second switches, and only one amplifier having an input connected to a second terminal of said one charge capacitor and an output connected to the input of said amplifier by a third switch; and an encoder for encoding an output signal of said comparator.

2. The A/D converter as defined in claim 1, wherein said converter includes a plurality of said comparators, and a plurality of said reference voltages generated in said reference voltage generator are input to the respective comparators by way of the array of said second switches.

3. The A/D converter as defined in claim 2, wherein said converter includes a pair of said reference voltage generators, and the respective comparators include a pair of said first switches, the array of said second switches, said third switch and said charge capacitor, and said amplifier is a differential amplifier for comparing said input analogue differential signal with the pair of said reference voltages.

4. An A/D converter comprising:

first and second reference voltage generator for generating a plurality of first reference voltages and a plurality of second reference voltages, respectively;

fourth and fifth switches each having a first terminal connected to an analogue input signal and to an inverted signal of said analogue input signal, respectively;

an array of sixth switches having respective first terminals connected to said first reference voltages and respective second terminals connected in common to second terminals of said fourth switch;

an array of seventh switches having respective first terminals connected to said second reference voltages and respective second terminals connected in common to said second terminal of said fifth switch;

a first charge capacitor having a first terminal connected to said fourth switch and to second terminals of the array of said sixth switches, a second charge capacitor having a first terminal connected to said fifth switch and to second terminals of the array of said seventh switches connected in common, a differential amplifier having a non-inverting input connected to an inverting output thereof by way of an eighth switch and to said first charge capacitor, and an inverting input connected to said non-inverting output thereof by way of a ninth switch and to said second charge capacitor;

an encoder for encoding said outputs of said differential amplifier; and a control section for controlling timing of the above switches.

5. A serial-to-parallel type A/D converter comprising:

a sampling-holding circuit, an interstage amplifier, said A/D converter as claimed in claim 1 having low resolution, a subtracter and a digital circuit.

6. A serial-to-parallel type A/D converter comprising:

a sampling-holding circuit, an interstage amplifier, said A/D converter as claimed in claim 4 having low resolution, a subtracter and a digital circuit.

7. A pipeline type A/D converter comprising a plurality of parties connected in series, each of which comprises a sampling-holding circuit, an interstage amplifier, said A/D converter as claimed in claim 1 having low resolution, a subtracter and a digital circuit.

8. A pipeline type AID converter comprising a plurality of parties connected in series, each of which comprises a sampling-holding circuit, an interstage amplifier, said A/D converter as claimed in claim 4 having low resolution, a subtracter and a digital circuit.

* * * * *